(12) United States Patent
Robin et al.

(10) Patent No.: US 10,580,931 B2
(45) Date of Patent: Mar. 3, 2020

(54) METHOD FOR MAKING A GALLIUM NITRIDE LIGHT-EMITTING DIODE

(71) Applicant: Commissariat à l'Énergie Atomique et aux Énergies Alternatives, Paris (FR)

(72) Inventors: Ivan-Christophe Robin, Grenoble (FR); Matthew Charles, Grenoble (FR); Yohan Desieres, Lans en Vercors (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 16/306,971

(22) PCT Filed: Jun. 2, 2017

(86) PCT No.: PCT/FR2017/051400
§ 371 (c)(1),
(2) Date: Dec. 4, 2018

(87) PCT Pub. No.: WO2017/216445
PCT Pub. Date: Dec. 21, 2017

(65) Prior Publication Data
US 2019/0214523 A1   Jul. 11, 2019

(30) Foreign Application Priority Data
Jun. 17, 2016 (FR) ..................... 16 55678

(51) Int. Cl.
| *H01L 33/46* | (2010.01) |
| *H01L 33/00* | (2010.01) |
| *H01L 33/16* | (2010.01) |
| *H01L 33/20* | (2010.01) |
| *H01L 33/22* | (2010.01) |
| *H01L 33/18* | (2010.01) |

(Continued)

(52) U.S. Cl.
CPC ........ *H01L 33/007* (2013.01); *H01L 33/0079* (2013.01); *H01L 33/16* (2013.01);
(Continued)

(58) Field of Classification Search
None
See application file for complete search history.

(56) References Cited

U.S. PATENT DOCUMENTS 7,745,843 B2 * 6/2010 Baba ..................... H01L 33/20
257/95
9,362,449 B2 * 6/2016 Kim ..................... H01L 33/20
(Continued)

FOREIGN PATENT DOCUMENTS

EP    2 056 368 A1    5/2009

OTHER PUBLICATIONS

International Search Report for International Application No. PCT/FR2017/051400, dated Sep. 26, 2017.
(Continued)

*Primary Examiner* — Minh Loan Tran
(74) *Attorney, Agent, or Firm* — Wolf, Greenfield & Sacks, P.C.

(57) ABSTRACT

A method of manufacturing a gallium nitride light-emitting diode, including the successive steps of: a) forming a planar active gallium nitride light-emitting diode stack including first and second doped gallium nitride layers of opposite conductivity types and, between the first and second gallium nitride layers, an emissive layer with one or a plurality of quantum wells; and b) growing nanowires on the surface of the first gallium nitride layer opposite to the emissive layer.

8 Claims, 3 Drawing Sheets

(51) Int. Cl.
*H01L 33/24* (2010.01)
*H01L 33/32* (2010.01)

(52) U.S. Cl.
CPC .............. *H01L 33/18* (2013.01); *H01L 33/20* (2013.01); *H01L 33/22* (2013.01); *H01L 33/24* (2013.01); *H01L 33/32* (2013.01); *H01L 33/46* (2013.01); *H01L 33/0075* (2013.01); *H01L 2933/0025* (2013.01); *H01L 2933/0083* (2013.01)

(56) References Cited

U.S. PATENT DOCUMENTS

| | | | |
|---|---|---|---|
| 9,450,153 B2* | 9/2016 | Lim | ........................ H01L 33/22 |
| 2008/0036038 A1* | 2/2008 | Hersee | ................... B82Y 20/00 |
| | | | 257/615 |
| 2008/0149916 A1 | 6/2008 | Baba et al. | |
| 2010/0035416 A1* | 2/2010 | Chen | ................. H01L 21/02381 |
| | | | 438/481 |
| 2014/0353582 A1 | 12/2014 | Kim et al. | |
| 2016/0087158 A1 | 3/2016 | Lim et al. | |

OTHER PUBLICATIONS

Preliminary Search Report for French Application No. 1655678, dated Dec. 20, 2016.
Chen et al., Homoepitaxial growth of catalyst-free GaN wires on N-polar substrates. Applied Physics Letters. 2010;97(15):151909.
Van Dam et al., Strong diameter-dependence of nanowire emission coupled to waveguide modes. Applied Physics Letters. 2016;108:121109.

* cited by examiner

METHOD FOR MAKING A GALLIUM NITRIDE LIGHT-EMITTING DIODE

This application is a national stage filing under 35 U.S.C. § 371 of International Patent Application Serial No. PCT/FR2017/051400, filed Jun. 2, 2017, which claims priority to French patent application FR16/55678, filed Jun. 17, 2016. The entire contents of these applications are incorporated herein by reference in their entireties.

BACKGROUND

The present application relates to the field of optoelectronic devices. It more particularly concerns the forming of gallium nitride (GaN) light-emitting diodes (LEDs).

DISCUSSION OF THE RELATED ART

Conventionally, a GaN LED is essentially formed of a planar active stack of an N-type doped GaN layer or cathode layer, of an emissive layer with one or a plurality of quantum wells arranged on top of and in contact with the N-type doped GaN layer, and of a P-type doped GaN layer or anode layer arranged on top of and in contact with the emissive layer. The operation of such a LED relies on the emission of photons by recombination of electron-hole pairs electrically injected into the emissive layer.

A problem which is posed is that some of the photons generated in the emissive layer are emitted according to propagation directions forming with the normal to the stack an angle greater than the limiting angle of total reflection on the upper and lower surfaces of the stack. The photons then remain confined within the LED, which limits the light emitting efficiency of the LED.

To improve the light efficiency and/or control the emission directivity of a GaN LED, it has already been provided to form microstructures on the output surface of the LED. Such microstructures may be formed by chemical etching or by lithography and etching of the LED output surface, after the forming of the active stack of the LED, or also by texturing of the growth substrate prior to the forming of the active LED stack. Such methods however have the disadvantages of altering at least one layer of the LED, which may result in altering some of the characteristics of the LED, and/or of exhibiting limitations relative to the form factors and/or to the dimensions of the structures capable of being formed.

SUMMARY

Thus, an embodiment provides a method of manufacturing a gallium nitride light-emitting diode, comprising the successive steps of:

a) forming a planar active gallium nitride light-emitting diode stack comprising first and second doped gallium nitride layers of opposite conductivity types and, between the first and second gallium nitride layers, an emissive layer with one or a plurality of quantum wells; and b) growing nanowires on the surface of the first gallium nitride layer opposite to the emissive layer.

According to an embodiment, the nanowires are made of gallium nitride.

According to an embodiment, the growth of the nanowires is performed by vapor phase epitaxy in an atmosphere containing silane.

According to an embodiment, the nanowires are made of zinc oxide.

According to an embodiment, the growth of the nanowires is implemented in a chemical bath.

According to an embodiment, the method further comprises forming a reflective structure on the side of the surface of the second gallium nitride layer opposite to the emissive layer.

According to an embodiment, the reflective structure is a Bragg mirror only comprising materials having a melting point higher than 1,100° C.

According to an embodiment, the reflective structure is a metal layer.

According to an embodiment, step a) comprises a step of depositing the planar active stack by epitaxy on a growth substrate, and a step of transferring the planar active stack onto a support and growth substrate removal substrate.

According to an embodiment, the thickness of the first gallium nitride layer between the emissive layer and the base of the nanowires is smaller than the emission wavelength of the emissive layer.

According to an embodiment, the nanowires have a tapered shape with a diameter which progressively increases as the distance to the first gallium nitride layer increases.

Another embodiment provides a gallium nitride light-emitting diode, comprising:

a planar active gallium nitride light-emitting diode stack comprising first and second doped gallium nitride layers of opposite conductivity types and, between the first and second gallium nitride layers, an emissive layer with one or a plurality of quantum wells; and a plurality of nanowires arranged on the surface of the first gallium nitride layer opposite to the emissive layer.

According to an embodiment, the nanowires are made of gallium nitride or of zinc oxide.

According to an embodiment, the nanowires have a tapered shape with a diameter which progressively increases as the distance to the first gallium nitride layer increases.

According to an embodiment, the thickness of the first gallium nitride layer between the emissive layer and the base of the nanowires is smaller than the emission wavelength of the emissive layer.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1A:
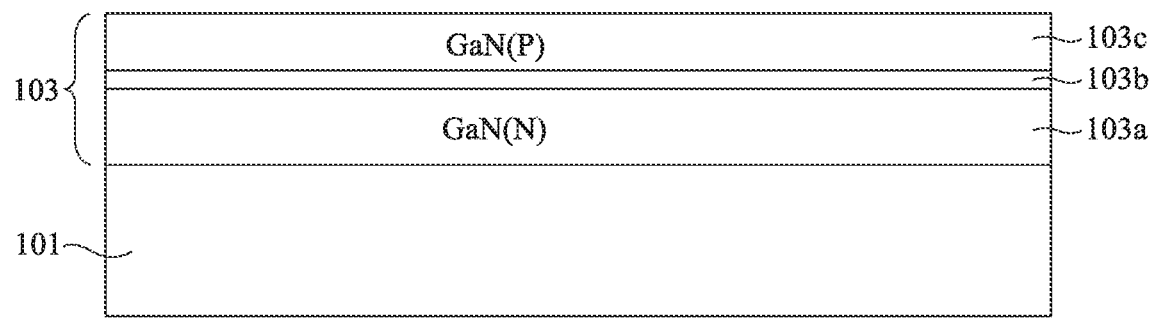
FIGS. 1A, 1B, 1C are cross-section views illustrating steps of an embodiment of a GaN LED manufacturing method.

The same elements have been designated with the same reference numerals in the different drawings and, further, the various drawings are not to scale. For clarity, only those elements which are useful to the understanding of the described embodiments have been shown and are detailed. In particular, the forming of the contact metallizations on the anode and cathode layers of GaN LEDs has not been shown, the described embodiments being compatible with usual manufacturing methods and layouts of GaN LED anode and cathode contact metallizations. In the following description, unless otherwise indicated, when reference is made to terms qualifying absolute positions, such as terms "front", "back", "top", "bottom", "left", "right", etc., or relative positions, such as terms "above", "below", "upper", "lower", etc., or to terms qualifying directions, such as terms "horizontal", "vertical", etc., it is referred to the orientation of the corresponding cross-section views, it being understood that, in practice, the described structures may be oriented differently. The terms "approximately", "substantially", and "in the order of" are used herein to designate a tolerance of plus or minus 10%, preferably of plus or minus 5%, of the value in question.

According to an aspect of an embodiment, a GaN LED manufacturing method comprising, after the forming of a planar GaN LED active stack, a step of growing nanowires on the output surface of the active LED stack, is provided. An advantage is that the nanowire growth step causes no alteration of the previously-formed layers of the active LED stack. Further, nanowires form structures particularly capable of improving the light extraction and/or the control of the emission directivity of a GaN LED. Nanowire here means wires having a diameter smaller than one micrometer, for example, a diameter in the range from 50 to 250 nm, and having a length or height capable of reaching several micrometers, for example, a length in the range from 0.5 to 15 μm.

Figure 1B:
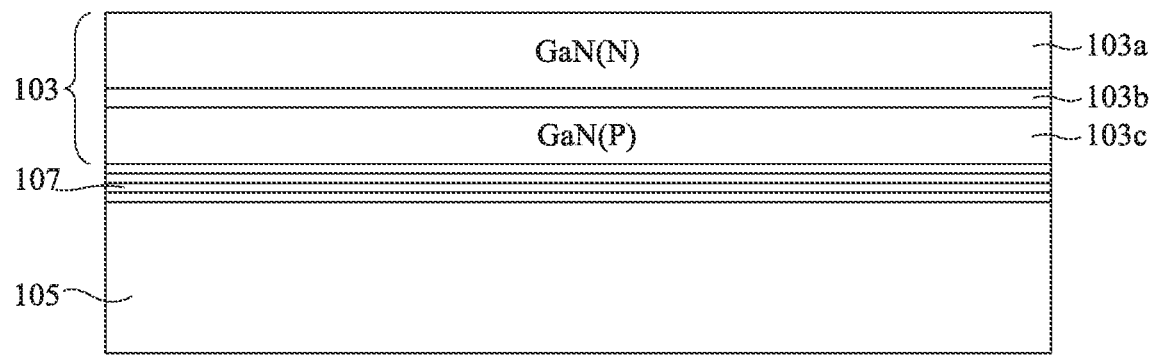
Figure 1C:
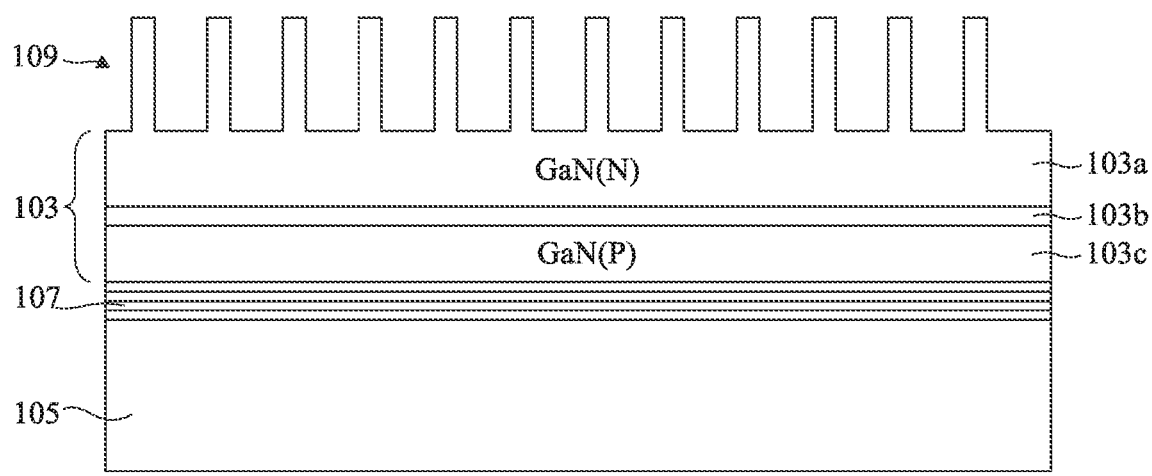

FIGS. 1A, 1B, 1C are cross-section views illustrating steps of an embodiment of a GaN LED manufacturing method.

FIG. 1A illustrates a step of forming, on the upper surface of a growth substrate 101, a planar active GaN LED stack 103. Substrate 101 is for example a substrate made of sapphire, corundum, silicon, or any other material onto which a stack of layers made up of gallium nitride can be deposited. In this example, active GaN LED stack 103 comprises, in the following order from the upper surface of the substrate, an N-type doped GaN layer or cathode layer 103a, an emissive layer 103b, and a P-type doped GaN layer or anode layer 103c. Emissive layer 103b is for example formed by a stack of one or a plurality of emissive layers, each forming a quantum well, for example, made up of GaN, InN, InGaN, AlGaN, AlN, AlInGaN, GaP, AlGaP, or AlInGaP, and being each arranged between two barrier layers, for example, based on GaN. In this example, the lower surface of emissive layer 103b is in contact with the upper surface of cathode layer 103a, and the upper surface of emissive layer 103b is in contact with the lower surface of anode layer 103c. Stack 103 is capable of emitting photons from its emissive layer 103b when it is crossed by a current flowing from its anode layer 103c to its cathode layer 103a. Active stack 103 is for example deposited by epitaxy on growth substrate 101. A buffer layer, not shown, for example, made of an AlN—GaN alloy, may form an interface between growth substrate 101 and the lower GaN layer 103a of the stack.

FIG. 1B illustrates a step of transferring active GaN LED stack 103 onto a support substrate 105, for example, a substrate made of sapphire, of corundum, of silicon, of glass, etc., and then of removing growth substrate 101. During this step, the assembly comprising growth substrate 101 and active stack 103 may be flipped, to direct the upper surface (in the orientation of FIG. 1A) of anode layer 103c towards the upper surface of support substrate 105. In the shown example, prior to the transfer of active stack 103 onto support substrate 105, a planar reflective layer 107 is formed on the upper surface of support substrate 105 or on the upper surface (in the orientation of FIG. 1A) of layer 103c. Thus, after the transfer, reflection structure 107 forms an interface between the lower surface of layer 103c and the upper surface of substrate 105. After the transfer, growth substrate 101 is removed to expose the upper surface of gallium nitride layer 103a. Substrate 101 is for example removed by grinding and/or etching from its surface opposite to active stack 103. As a variation, in the case of a transparent substrate 101, for example, a sapphire or corundum substrate, substrate 101 may be separated from active stack 103 by means of a laser beam projected through substrate 101 from its surface opposite to active stack 103 (by a method of lift-off laser type). More generally, any other method enabling to remove growth substrate 101 may be used. After the removal of substrate 101, an additional etch step may be provided to remove possible buffer layers remaining on the upper surface side of gallium nitride layer 103a. Further, part of the thickness of gallium nitride layer 103a may be removed, for example, by etching.

In this example, the output surface of the GaN LED is its surface opposite to support substrate 105, corresponding to the upper surface of cathode layer 103a in the shown example. Support substrate 105 may be transparent or opaque. Structure 107 has the function of reflecting, towards the LED output surface, possible photons emitted by layer 103b towards support substrate 105, to improve the light emitting efficiency of the LED. Reflective structure 107 is for example a Bragg mirror formed of a stack of dielectric layers capable of withstanding high temperatures, for example, higher than 1,100° C. This advantageously enables structure 107 to be able to withstand without being altered a subsequent step (FIG. 1C) of nanowire growth on the upper surface of layer 103a, formed by high-temperature epitaxy. As an example, the reflective structure comprises an alternation of $TiO_2$ (melting point in the order of 1,800° C.) and of $SiO_2$ (melting point in the order of 1,700° C.). The upper layer of structure 107, in contact with the lower surface of anode layer 103c, is preferably a conductive layer, for example, an ITO layer (indium tin oxide—melting point in the range from 1,500 to 1,900° C.), which advantageously enables to ease the taking of an electric contact on anode layer 103c and to improve the homogeneity of the electric current injected into the LED.

FIG. 1C illustrates a step subsequent to the step of FIG. 1B, during which GaN nanowires 109 are grown on the upper surface of cathode layer 103a. Nanowires 109 are formed by a subsequent epitaxial growth on the upper surface of layer 103a. The epitaxy conditions are selected to be capable of causing the growth of nanowires on the upper surface of layer 103a, along a direction substantially orthogonal to the upper surface of layer 103a. To achieve this, an epitaxy method of the type described in the article entitled "Homoepitaxial growth of catalyst-free GaN wires on N-polar substrates" of X. J. Chen et al. (applied physics letters 97, 151909 2010) is for example used. The previously-formed planar active stack is preferably such that, in the orientation of FIGS. 1B and 1C, the upper surface of GaN layer 103a (that is, its surface opposite to emissive layer 103b) has a nitrogen polarity. The growth of GaN nanowires on a GaN substrate is indeed easier on the surface of nitrogen polarity of the substrate than on its surface of gallium polarity. The growth of nanowires 109 is for example carried out by MOVPE ("metal-organic vapor phase epitaxy") in an atmosphere containing silane, for example, at a temperature in the order of 1,050° C. To control the positioning and the dimensions of nanowires 109, a mask comprising openings delimiting the growth areas of nanowires 109, for example, a silicon nitride mask, may optionally be formed on the upper surface of layer 103a prior to the nanowire growth step.

Anode and cathode contact metallizations, not shown, may be formed respectively in electric contact with anode and cathode layers 103c and 103a of the LED. As an example, an anode contact may be taken from the upper surface of the structure, in a peripheral area of the LED which does not comprise active layer 103b, cathode layer 103a, and nanowires 109. A cathode contact may be taken from the upper surface of the structure, in a peripheral area of the LED which does not comprise nanowires 109. In practice, an optoelectronic device comprising a plurality of identical LEDs or the like arranged on a same support substrate 105 may be provided, for example, to form a microscreen-type display device.

The dimensions and the positioning of nanowires 109 may be adjusted according to the desired extraction and/or emission directivity features. As an example, nanowires 109 having a substantially constant diameter along their entire height, this diameter being selected to be as high as possible while remaining sufficiently low to obtain a monomode guiding of the light at the emission wavelength of emissive layer 103b, may be provided. As an example, the diameter may be calculated according to the teachings described in "Optical Waveguide Theory" of A. W. Snyder and J. Love. This provides a good emission directivity of the LED. Further, to limit parasitic couplings between neighboring nanowires, it may be chosen to respect a minimum distance between nanowires, for example, a distance at least equal to 1.3 time the nanowire diameter. As an example, for an emission wavelength in the order of 400 nm, the diameter of wires 109 may be in the order of 130 nm, with a distance between neighboring nanowires of at least 260 nm.

Preferably, to efficiently couple the light source formed by emissive layer 103b and nanowires 109, the thickness of GaN layer 103a between emissive layer 103b and nanowires 109 is smaller than the emission wavelength of the LED in GaN (divided by the refraction index of GaN), for example, at least ten times smaller than the emission wavelength of the LED in GaN.

Figure 2A:
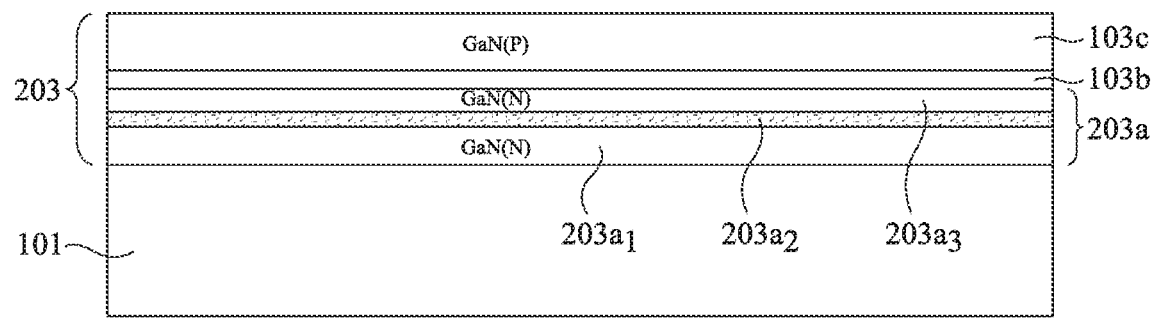
FIGS. 2A, 2B, 2C, are cross-section views illustrating steps of an alternative embodiment of the method of FIGS. 1A, 1B, 1C.
Figure 2B:
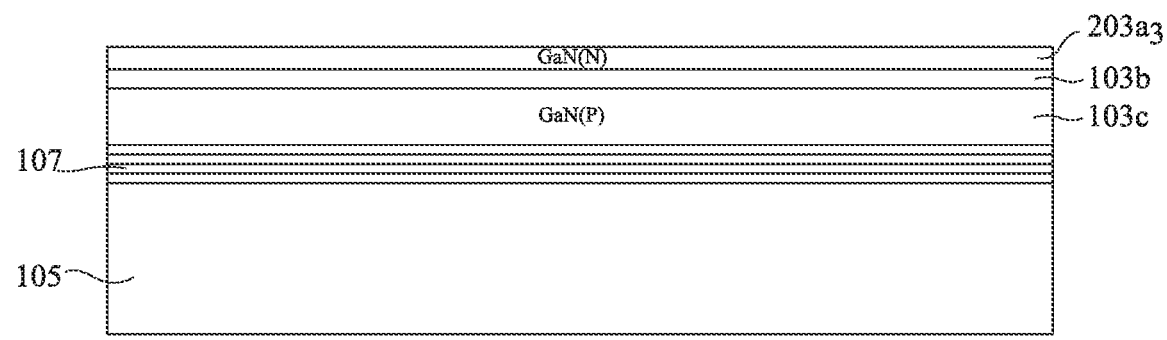
Figure 2C:
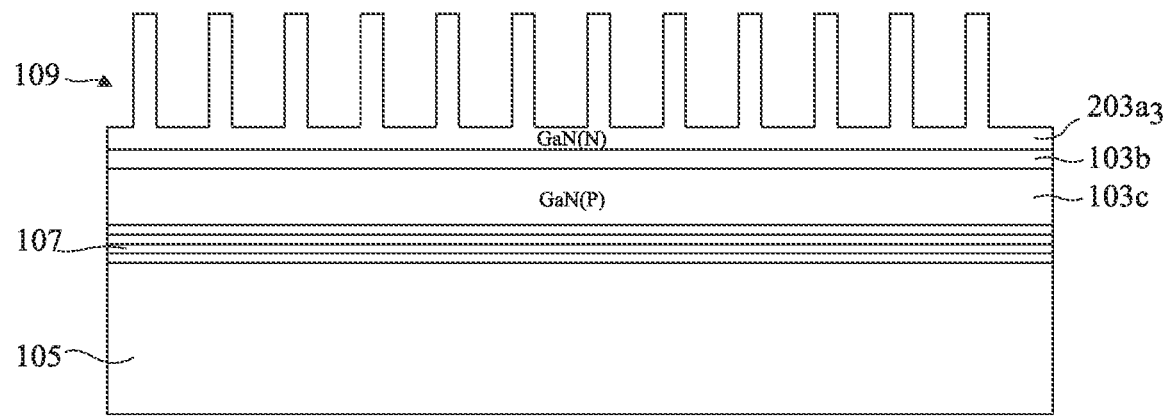

FIGS. 2A, 2B, 2C are cross-section views illustrating steps of an alternative embodiment of the method of FIGS. 1A, 1B, 1C, enabling to ease the control of the thickness of the N-type doped GaN layer extending between emissive layer 103b and nanowires 109. This method comprises elements common with the method of FIGS. 1A, 1B, 1C. Hereafter, only the differences between the two methods will be highlighted.

FIG. 2A illustrates a step similar to the step described in relation with FIG. 1A of forming, on the upper surface of a growth substrate 101, a stack 203 which differs from stack 103 of FIG. 1A essentially in that, in stack 203, layer 103a of FIG. 1A is replaced with a stack 203a comprising, in the following order from the upper surface of substrate 101, a first N-type doped GaN layer $203a_1$, an etch stop layer $203a_2$, and a second N-type doped GaN layer $203a_3$. In this example, the active GaN LED stack is formed by layers $203a_3$ (cathode layer), 103b (emissive layer), and 103c (anode layer). GaN layer $203a_1$ has as a main function to improve the mechanical resistance and the quality of the epitaxy of the active stack. Layer $203a_2$ is made of a material different from GaN, for example, aluminum nitride (AlN), and particularly has the function of behaving as an etch stop layer during a subsequent step (FIG. 1B) of removal of GaN layer $203a_1$.

FIG. 2B illustrates a step similar to the step described in relation with FIG. 1B of transferring stack 203 onto a support substrate 105, and then of removing growth substrate 101. During this step, GaN layer $203a_1$ and etch stop layer $203a_2$ are further removed to expose the upper surface of GaN layer $203a_3$. The removal of layer $203a_1$ is for example carried out by chlorinated ICP-RIE ("Inductively Coupled Plasma Reactive Ion Etching"). The removal of layer $203a_2$ may also be formed by chlorinated ICP-RIE etching, with a gallium detection by mass spectroscopy to stop the etching on the upper surface of layer $203a_3$.

FIG. 2C illustrates a step subsequent to the step of FIG. 2B, similar to the step described in relation with FIG. 1C, during which GaN nanowires 109 are grown on the upper surface of cathode layer $203a_3$.

Figure 3:
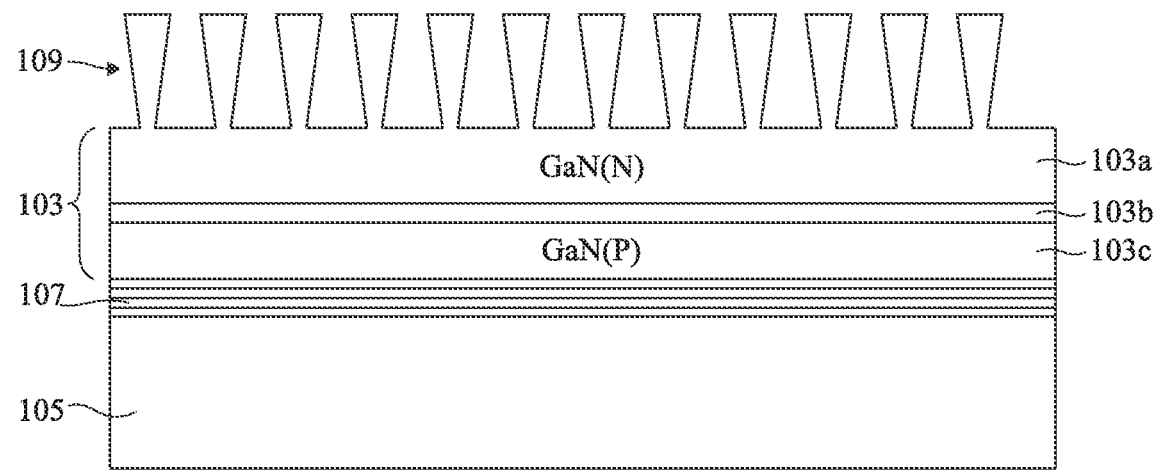
FIG. 3 is a cross-section view illustrating another alternative embodiment of GaN LED manufacturing method.

FIG. 3 illustrates an alternative embodiment of the method of FIGS. 1A, 1B, 1C. This method for example comprises the same initial steps (FIGS. 1A and 1B) as in the example described in relation with FIGS. 1A, 1B, 1C, but differs from the example mainly by the shape of GaN nanowires 109 formed on the upper surface of cathode layer 103a of the LED. In the example of FIG. 3, nanowires 109 have a tapered shape with a diameter progressively increasing as the distance to the upper surface of layer 103a increases. The progressive widening of the nanowires enables to release the radial confinement of the electromagnetic field, thus limiting the diffraction at the end of the wire. This enables to increase the emission directivity of the LED. Such a tapered shape may for example be obtained by progressively decreasing the epitaxy temperature along the nanowire growth, for example, from a temperature in the order of 1,050° C. at the beginning of the epitaxy to a temperature in the order of 900° C. at the end of the epitaxy. The distance between neighboring nanowires at the base of the nanowires (that is, at the level of the upper surface of layer 103a) may be selected to be greater than or of the same order as the diameter of the nanowires at the end of the nanowires opposite to layer 103a, and typically greater than 1.3 time the wire diameter at the level of the upper surface of layer 103. As an example, for an emission wavelength in the order of 400 nm, the diameter of nanowires 109 may be in the order of 130 nm at the base, and in the order of 1 μm at the end opposite to layer 103a, with a distance between neighboring nanowires in the order of 1 μm. Nanowires 109 may possibly coalesce at the level of their end opposite to layer 103a, to form a substantially planar continuous surface at the level of their end opposite to layer 103a. In this case, a conductive layer which is transparent, for example, made of ITO, or semi-transparent, for example, made of metal, may be formed on top of and in contact with the upper surface of the nanowires, which advantageously enables to ease the taking of an electric cathode contact and to improve the homogeneity of the current injected into the LED.

Figure 4:
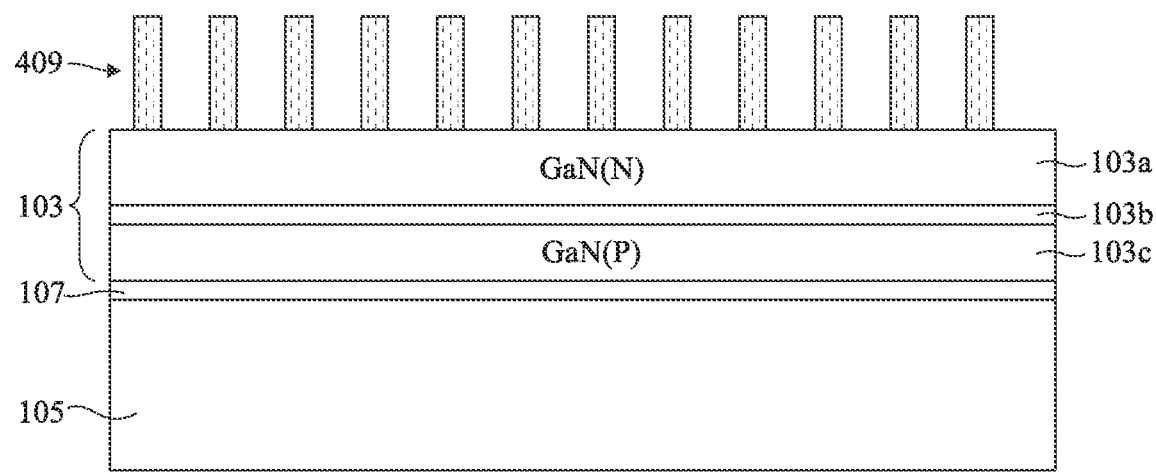
FIG. 4 is a cross-section view illustrating another alternative embodiment of a GaN LED manufacturing method.

FIG. 4 illustrates another alternative embodiment of the method of FIGS. 1A, 1B, 1C. This method for example comprises the same initial steps (FIGS. 1A and 1B) as in the example described in relation with FIGS. 1A, 1B, 1C, but differs from this example mainly in that, in the example of FIG. 4, the GaN nanowires 109 formed on the upper surface of cathode layer 103a are replaced with zinc oxide (ZnO) nanowires 409. As an example, the growth of zinc oxide nanowires 409 is implemented in a chemical bath at low temperature, for example, at a temperature in the range from 60 to 150° C. The growth of zinc oxide nanowires 409 is for example implemented by a method of the type described in the article entitled "Selective Area Growth of Well-Ordered ZnO Nanowire Arrays with Controllable Polarity" of Vincent Consonni et al. (ACS Nano, 2014, 8 (5), pp. 4761-4770).

An advantage of the alternative embodiment of FIG. 4 is not to require a step of high-temperature epitaxy to form the nanowires on the upper surface of the LED. Reflective structure 107 can then be formed by a simple reflective metal layer, for example, an indium-silver alloy. This enables to obtain both a good photon reflection coefficient, to take an electric contact of good quality on anode layer 103c, and to simplify the forming of structure 107 (as compared with the provision of a Bragg mirror).

Specific embodiments have been described. Various alterations and modifications will occur to those skilled in the art. In particular, it should be noted that the alternative embodiments of FIGS. 3 and 4 may be adapted to the method of FIGS. 2A, 2B, 2C.

Further, the conductivity types of gallium nitride layers 103a, 203$a_3$ (of type N in the described examples) and 103c (of type P in the described examples), may be inverted, the anode and cathode regions of the LEDs also being inverted.

Further, the described embodiments are not limited to the above-mentioned examples where the active GaN LED stack is formed on a growth substrate 101, and then transferred onto a support substrate 105. As a variation, the initial substrate may be a self-supporting GaN substrate, for example, N-type doped, having active stack 103 epitaxially grown on a surface thereof. As an example, active stack 103 is formed on the surface of nitrogen polarity of the substrate. In this case, GaN nanowires may be directly formed on the surface of the active stack opposite to the substrate, which is a surface of nitrogen polarity.

Further, to increase the coupling between the emission area and the nanowires and avoid for photons to come out of the active LED stack between nanowires, a reflective metal, for example, silver, may be deposited on the upper surface of layer 103a between nanowires 109, 409. As an example, this metal may be deposited before the growth of nanowires on the entire surface of layer 103a, and then locally removed from the nanowire growth areas. As a variation, the reflective metal may be deposited over the entire surface of the LED after the forming of nanowires 109, 409, for example, by a conformal deposition method, after which a step of directional etching may be implemented to remove the metal from the upper surface of nanowires 109, 409.

Further, as a variation, in the case where nanowires 109 are made of GaN, one may, by modifying the conditions of the epitaxy, grow around nanowires 109 shells containing quantum wells capable of converting to another color part of the light emitted by layer 103b. As an example, layer 103b may be capable of emitting blue light, and quantum wells capable of converting part of the blue light emitted by the LED into yellow light may be formed around nanowires 109, to obtain a LED emitting white light.

The invention claimed is:

1. A method of manufacturing a gallium nitride light-emitting diode, comprising the successive steps of:
   a) forming by epitaxy, on a growth substrate, a planar active gallium nitride light-emitting diode stack comprising, in the following order from the growth substrate, a first N-type doped gallium nitride layer, an emissive layer with one or a plurality of quantum wells, and a second P-type doped gallium nitride layer, the surface of the first gallium nitride layer facing the growth substrate being of nitrogen polarity;
   b) transferring the planar active stack onto a support substrate and removing the growth substrate to free the access to said surface of nitrogen polarity of the first gallium nitride layer; and
   c) growing gallium nitride nanowires by vapor phase epitaxy on said surface of nitrogen polarity of the first gallium nitride layer.

2. The method of claim 1, further comprising, between step a) and step b), a step of forming a reflective structure on the surface of the second gallium nitride layer opposite to the emissive layer or on the support substrate, so that, after step b), the reflective structure forms an interface between the second gallium nitride layer and the support substrate,
   wherein the reflective structure is a Bragg mirror only comprising materials having a melting point higher than 1,100° C.

3. The method of claim 1, wherein the thickness of the first gallium nitride layer between the emissive layer and the base of the nanowires is smaller than the emission wavelength of the emissive layer.

4. The method of claim 1, wherein the nanowires have a diameter in the range from 50 to 250 nm, and a length in the range from 0.5 to 15 µm.

5. The method of claim 1, wherein the nanowires have a tapered shape with a diameter which progressively increases as the distance to the first gallium nitride layer increases.

6. The method of claim 5, wherein, to obtain said tapered shape, the epitaxy temperature is progressively decreased along the growth of the nanowires.

7. The method of claim 6, wherein said epitaxy temperature is progressively decreased from a temperature in the order of 1,050° C. at the beginning of the epitaxy to a temperature in the order of 900° C. at the end of the epitaxy.

8. A gallium nitride light-emitting diode formed by the method of claim 1.

* * * * *